United States Patent
Cho et al.

(10) Patent No.: US 7,952,175 B2
(45) Date of Patent: May 31, 2011

(54) LEAD FRAME, SEMICONDUCTOR PACKAGE INCLUDING THE LEAD FRAME AND METHOD OF FORMING THE LEAD FRAME

(75) Inventors: Se-hoon Cho, Seongnam-si (KR); Jeung-il Kim, Seongnam-si (KR); Sang-moo Lee, Seongnam-si (KR)

(73) Assignee: Samsung Techwin Co., Ltd., Changwon (KR)

( * ) Notice: Subject to any disclaimer, the term of this patent is extended or adjusted under 35 U.S.C. 154(b) by 337 days.

(21) Appl. No.: 12/217,195

(22) Filed: Jul. 2, 2008

(65) Prior Publication Data
US 2009/0014854 A1    Jan. 15, 2009

(30) Foreign Application Priority Data
Jul. 9, 2007  (KR) .................. 10-2007-0068776

(51) Int. Cl.
*H01L 23/495* (2006.01)
(52) U.S. Cl. ........ 257/666; 257/670; 257/783; 257/787; 257/E23.031; 257/E23.035; 257/E23.037
(58) Field of Classification Search .......... 257/666–733, 257/772–796, E23.031–E23.059; 438/111, 438/112, 123, FOR. 366, FOR. 367, FOR. 377, 438/FOR. 380; 428/643–685
See application file for complete search history.

(56) References Cited

U.S. PATENT DOCUMENTS
7,245,007 B1 *  7/2007  Foster ................... 257/678

FOREIGN PATENT DOCUMENTS
JP        1-137660   *  5/1989 .............. 257/666

* cited by examiner

*Primary Examiner* — Jasmine J Clark
(74) *Attorney, Agent, or Firm* — Drinker Biddle & Reath LLP

(57) ABSTRACT

Provided are a lead frame and a semiconductor package including the same. The lead frame includes a first lead frame portion including a plurality of first leads; an adhesive member disposed such that the first leads are adhered to one surface of the adhesive member; and a second lead frame portion including a plurality of second leads disposed such that the second leads are adhered to the other surface of the adhesive member, wherein the second leads are arranged so as not to overlap with the first leads. The lead frame may optionally include a die pad on which a semiconductor chip is installed.

14 Claims, 5 Drawing Sheets

LEAD FRAME, SEMICONDUCTOR PACKAGE INCLUDING THE LEAD FRAME AND METHOD OF FORMING THE LEAD FRAME

CROSS-REFERENCE TO RELATED PATENT APPLICATION

This application claims the benefit of Korean Patent Application No. 10-2007-0068776, filed on Jul. 9, 2007, in the Korean Intellectual Property Office, the disclosure of which is incorporated herein in its entirety by reference.

BACKGROUND OF THE INVENTION

1. Field of the Invention

The present invention relates to a lead frame and a semiconductor package including the lead frame.

2. Description of the Related Art

Generally, since an electrical signal can not be transmitted or received by receiving electricity from the outside using only a semiconductor chip, there is a need for a technique in which a semiconductor chip is packaged in order to easily transfer various electrical signals of the semiconductor chip to the outside.

FIG. 1 is a cross-sectional view of a conventional semiconductor package 10.

Referring to FIG. 1, the conventional semiconductor package 10 includes a lead frame 11 including a die pad 11a and a lead 11b, a semiconductor chip 12 that is installed on the die pad 11a, a conductive wire 13 electrically connecting an input/output unit 12a of the semiconductor chip 12 to the lead 11b, and a mold resin 14 surrounding/encapsulating a part of the semiconductor chip 12 and the lead frame 11.

The conventional semiconductor package 10 is electrically connected to an external circuit board by the lead 11b that is exposed to the outside via a bottom surface of the semiconductor package 10.

The lead 11b includes a first lead portion 11b_1 and a second lead portion 11b_2. The lead 11b is individualized or separated into two lead portions, by cutting the lead 11b, using, for example, a sawing process after molding the lead 11b.

Since the number of input/output units 12a of the semiconductor chip 12 is large, more individualized leads are needed. Thus, the lead 11b is separated by sawing. However, in the lead individualizing/separating method, shavings generated during sawing must be removed. Typically a washing operation is used to remove shavings, and as such, an inner part of the lead 11b (i.e., a part where the wires 13 are connected) is exposed to the outside by a groove 11c formed by sawing and such part can possibly corrode due to this outside exposure. In addition, when plating or coating is additionally performed on the groove 11c in order to prevent such corrosion, manufacturing costs are increased correspondingly thereto.

SUMMARY OF THE INVENTION

According to an aspect of the present invention, there is provided a lead frame. In one embodiment an example lead frame comprises: a first lead frame portion including a plurality of first leads with a first spaced apart configuration; a second lead frame portion including a plurality of second leads with a second spaced apart configuration complementary to the first spaced apart configuration; and an adhesive member, the first leads being adhered to one surface of the adhesive member and the second leads being adhered to an opposite surface of the adhesive member.

The lead frame may comprise a die pad that is connected to either of the first and second lead frame portions.

The first leads may be supported by a first dambar.

The second leads may be supported by a second dambar.

The adhesive member may comprise a base film and an adhering portion formed on both sides of the base film.

According to another aspect of the present invention, a semiconductor package is provided that includes the present lead frame. In still another aspect, a method is provided for forming the lead frame for a semiconductor package.

BRIEF DESCRIPTION OF THE DRAWINGS

The above and other features of the present invention will become more apparent by describing in detail various example embodiments thereof with reference to the attached drawings in which.

DETAILED DESCRIPTION OF THE INVENTION

Hereinafter, a lead frame and semiconductor package including the lead frame will be described in detail by explaining exemplary embodiments of the invention with reference to the attached drawings.

Figure 1:
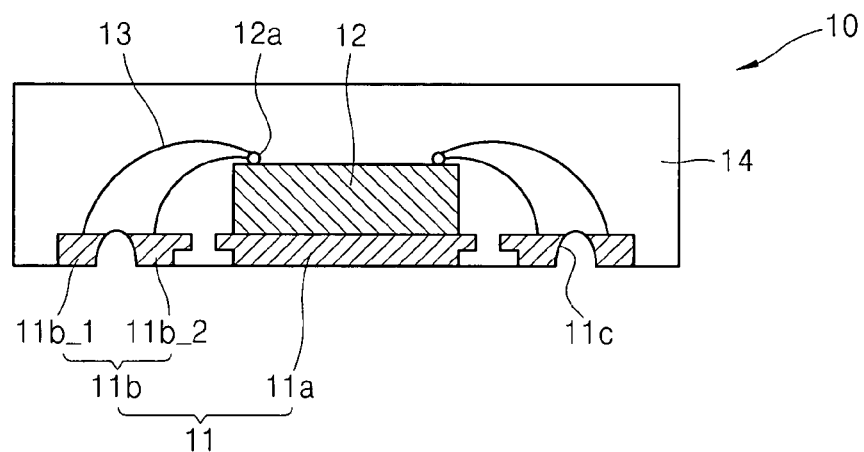
FIG. 1 is a cross-sectional view of a conventional semiconductor package.
Figure 2:
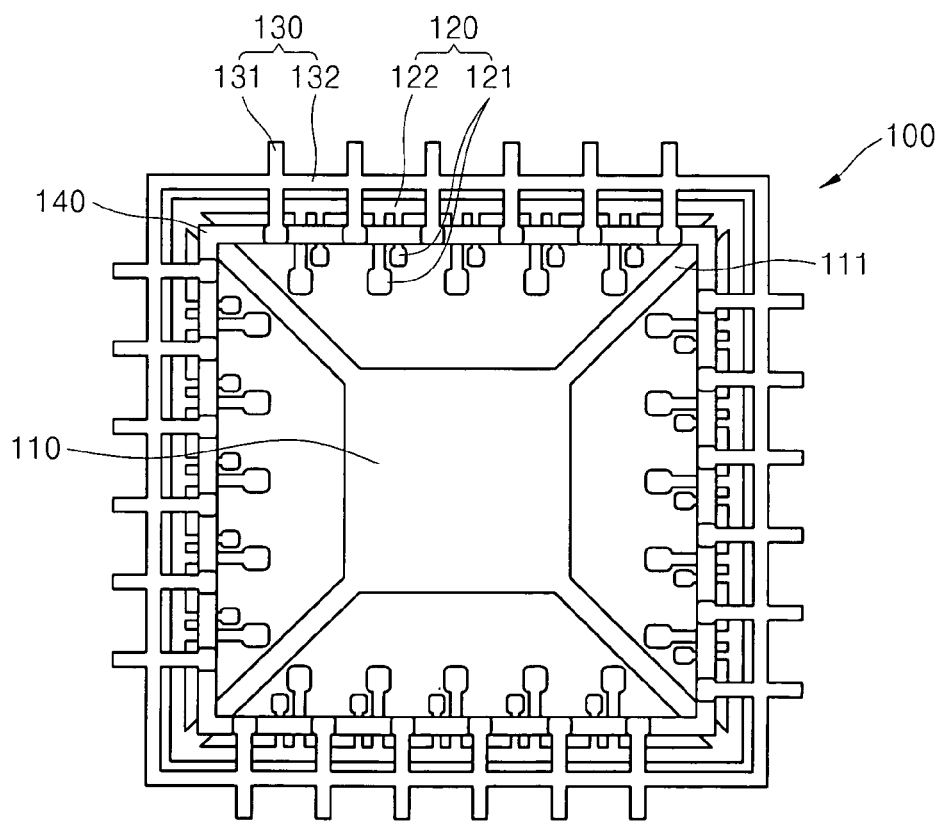
FIG. 2 is a plan view illustrating a partially-completed lead frame for a semiconductor package as formed after coupling together first and second lead frame portions, according to an embodiment of the present invention.
Figure 3:
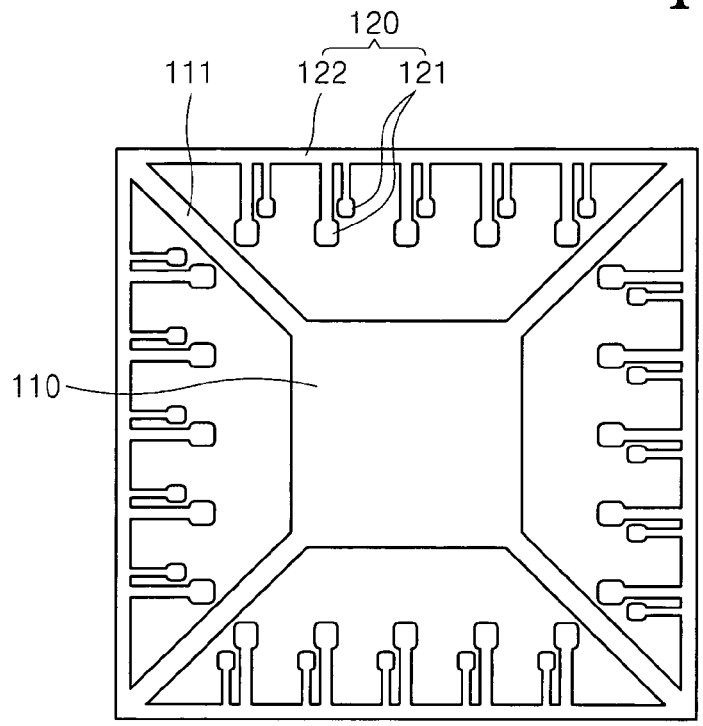
FIG. 3 is a plan view of a first lead frame portion of the lead frame of FIG. 2.
Figure 4:
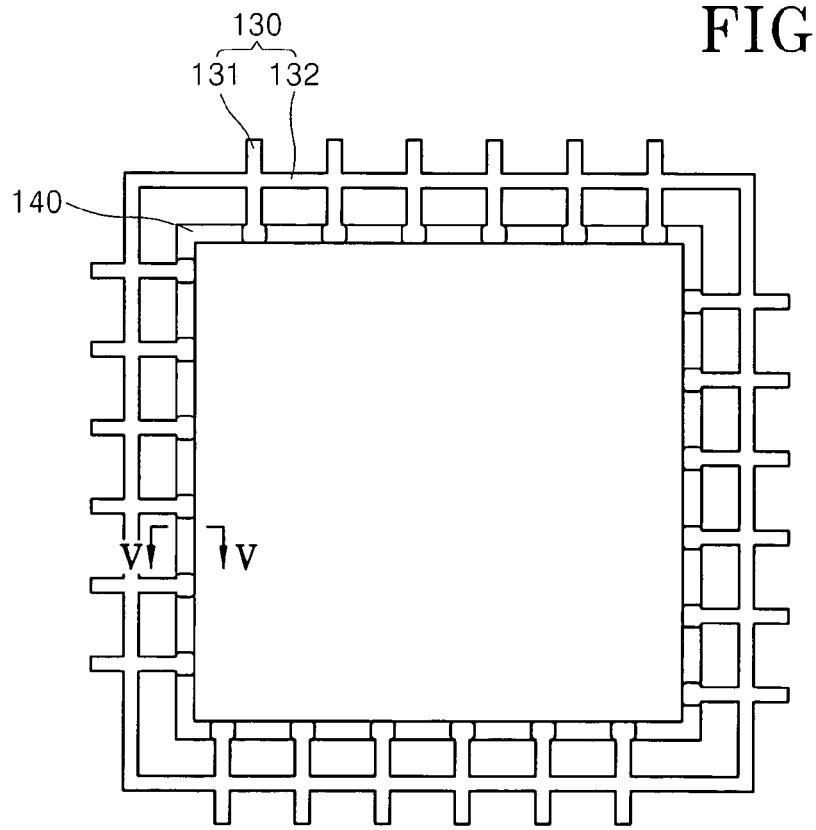
FIG. 4 is a plan view of a second lead frame portion of the lead frame and an adhesive member of FIG. 2.

FIG. 2 is a plan view of a lead frame 100 for a semiconductor package, according to an embodiment of the present invention. FIG. 3 is a plan view of a first lead frame portion 120 of the lead frame 100 of FIG. 2. FIG. 4 is a plan view of a second lead frame portion 130 and an adhesive member 140 of the lead frame 100 of FIG. 2.

Referring to FIG. 2, the lead frame 100 includes a die pad 110, the first lead frame portion 120, the second lead frame portion 130, and the adhesive member 140.

The lead frame 100 is assembled by disposing, configuring or otherwise arranging the second lead frame portion 130 on the first lead frame portion 120, such that the first lead frame portion 120 and the second lead frame portion 130 are fixed to each other by the adhesive member 140, which is interposed between the first and second lead frame portions 120, 130.

Although lead frame portion 120 is referred to as the first lead frame portion, lead frame portion 120 may alternatively be referred to as the second lead frame portion such that lead frame portion 130 is referred to as the first lead frame portion.

Figure 5:
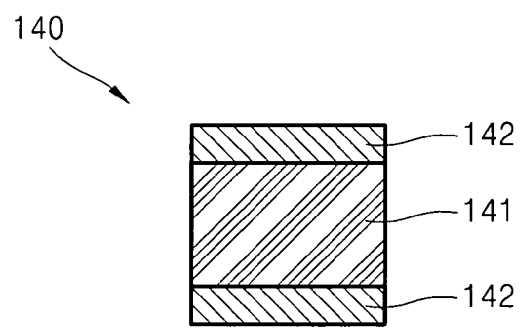
FIG. 5 is a cross-sectional view of the adhesive member taken along a line V-V of FIG. 4.

Referring to FIGS. 3, 4 and 5, each part of the lead frame 100 will be described.

The die pad 110 is configured to support a semiconductor chip, and is supported by a pad supporting unit 111 with respect to the first lead frame portion 120. According to the current embodiment of the present invention, the lead frame 100 includes the die pad 110, however, the present invention is not limited thereto. That is, a lead frame according to the present invention may not include a die pad. Such die pad absorbs/dissipates heat generated from a semiconductor chip, and supports the semiconductor chip until an electrode of the semiconductor chip and the lead frame are electrically connected to each other and are packaged. Thus, a changed structure or tool can be used instead to replace the die pad, which is then not required.

The first lead frame portion 120 includes a plurality of first leads 121, and a first dambar 122 that supports the first leads 121 such that the first leads 121 are spaced apart from each other by predetermined intervals. Furthermore, the first leads 121 extend away from the first dambar 122. As best shown in FIG. 3, the first dambar 122 is generally shaped as a square ring and the first leads 121 are spaced along the sides of the square ring and extend perpendicularly inwardly (i.e., toward an opposite side of the square ring) from each of the sides. Furthermore, the pad supporting unit 111 extends obliquely inward from the first dambar 122 to the die pad 110. As will be described hereinafter, at least part of the first lead frame portion 120 may be exposed to the outside of the semiconductor package during molding for forming the semiconductor package so that the first lead frame portion 120 can be electrically connected to an external circuit.

According to the current embodiment of the present invention, the die pad 110 and the first lead frame portion 120 are originally connected to the pad supporting unit 111, and the die pad 110, the first lead frame portion 120 and the pad supporting unit 111 are integrally or unitarily formed. However, the present invention is not limited thereto, and thus, according to the present invention, a die pad and a first lead frame portion can be independently formed to then be connected to each other. In addition, according to the present invention, the die pad may not be connected to the first lead frame portion, and can be instead integrally formed and connected to a second lead frame portion.

According to the embodiments of the present invention, the die pad 110 and the first lead frame portion 120 may be formed by stamping or etching a material used in a base metal (e.g., iron, nickel, alloy 42, copper and a copper alloy).

As illustrated in FIG. 4, the second lead frame portion 130 includes a plurality of second leads 131, and a second dambar 132 that supports the second leads 131 such that the second leads 131 are spaced apart from each other by a predetermined interval. The second leads 131 extend from the second dambar 132. As best shown in FIG. 4, the second dambar 132 is generally shaped as a square ring and the second leads 131 are spaced along the sides of the square ring and extend perpendicularly inwardly (i.e., toward an opposite side of the square ring) and outwardly from each of the sides. As can be appreciated from FIG. 2, the square ring-shaped dambar 132 of the second lead frame portion 130 is slightly greater in size (i.e., having a larger perimeter or longer/greater side distance) than the square ring-shaped dambar 122 of the first lead frame portion 120. That is, the first dambar 122 is circumscribed by the second dambar 132.

The second leads 131 are arranged/spaced apart so as not to overlap with the first leads 121. Furthermore, the first leads 121 are arranged/spaced apart so as not to overlap with the second leads 131. As shown, when the first and second dambars 122, 132 are arranged to be concentric, the first leads 121 are arranged between adjacent second leads 131, and the second leads 131 are arranged between adjacent first leads 121 so that the first and second leads 121, 131 are in an alternating configuration or arrangement. That is, the first and second leads 121, 131 have complementary configurations so that the first and second leads 121, 131 do not overlap or otherwise contact or interfere with each other. The lead frame 100 is assembled by arranging the first lead frame portion 120 and the second lead frame portion 130 to perpendicularly overlap with each other. Thus, when the lead frame 100 is viewed from above, the second leads 131 and the first leads 121 are arranged so that the second leads 131 and the first leads 121 can be simultaneously viewed. Due to such arrangement, a lead individualization or separation process, in which portions of the first dambar 122 and the second dambar 132 are removed, can be easily performed, as will be described later.

The second lead frame portion 130 may be formed by stamping or etching a material used in a base metal (e.g., iron, nickel, alloy 42, copper and a copper alloy), similarly as the first lead frame portion 120.

As illustrated in FIGS. 2 and 4, the overall shape of the adhesive member 140 is a square ring. Furthermore, as best shown in FIG. 2, the square ring-shaped adhesive member 140 is slightly smaller in size (i.e., having a smaller perimeter) than the square ring-shaped dambar 122 of the first lead frame portion 120.

Hence, the adhesive member 140 is disposed so as to be attached to one end of each of the second leads 131 of the second lead frame portion 130. That is, the size of the square of the adhesive member 140 is less than that of the second dambar 132, and thus the adhesive member 140 is only attached to the one end of each of the second leads 131, and is not attached to the second dambar 132.

As illustrated in FIG. 5, the adhesive member 140 includes a base film 141, and adhering portions 142 on top and bottom surfaces of the base film 141. Thus, the adhesive member 140 is configured as a double-sided adhesive tape.

A material used as the base film 141 is not limited to a particular material. For example, the base film 141 can be formed of polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, polycarbonate (PC), cellulous triacetate (TAC), or cellulose acetate propinonate (CAP).

The adhering portions 142 are formed by coating adhesives having predetermined adhesive strength on top and bottom surfaces of the base film 141. A material used as the adhesives of the adhering portion 142 is not limited to a particular adhesive material. For example, solvent evaporation-type adhesives can be used.

To complete the lead frame 100, the second lead frame portion 130 is arranged on the first lead frame portion 120 so that the first leads 121 and the second leads 131 are adhered to the top and bottom surfaces of the adhesive member 140, respectively or vice versa. Due to such structure, although the first dambar 122 and the second dambar 132 are removed using punching in a next operation, the first leads 121 and the second leads 131 are not scattered due to the adhesive member 140, and are spaced apart from each other at a predetermined interval, so as to be fixed to each other.

According to the current embodiment of the present invention, one surface of the adhesive member 140 is attached to one end of each of the second leads 131 of the second lead frame portion 130, and then the other surface of the adhesive member 140 is attached to one end of each of the first leads 121 of the first lead frame portion 120. However, the present invention is not limited thereto, and thus, according to the present invention, the other surface of the adhesive member may be attached to first leads 121, and then the one surface of the adhesive member may be attached to second leads 131. Furthermore, the lead frame portions 120, 130 may be attached to the adhesive member 140 substantially simultaneously or in any sequential order (e.g., first lead frame portion 120 is initially attached to the adhesive member 140 (or vice versa), second lead frame portion 120 is initially attached to the adhesive member 140 (or vice versa)).

As described above, the lead frame 100 is configured as one lead frame by overlapping the first lead frame portion 120 and the second lead frame portion 130. Thus, since the number of leads can be remarkably increased, a semiconductor package having many leads can be easily realized.

The lead frame 100 is configured so that the first leads 121 do not overlap with the second leads 131. Thus, since a punching process can be easily performed during a next lead individualization or separation process, the number of manufacturing operations and manufacturing cost can be reduced.

In addition, the lead frame 100 is configured so as not to interfere with an electrode of a semiconductor chip during a next wire-bonding process included in semiconductor packaging.

The lead frame 100, assembled as described herein, can be a part of a semiconductor package. A method of manufacturing a semiconductor package including the lead frame 100 will hereinafter be described.

Figure 6:
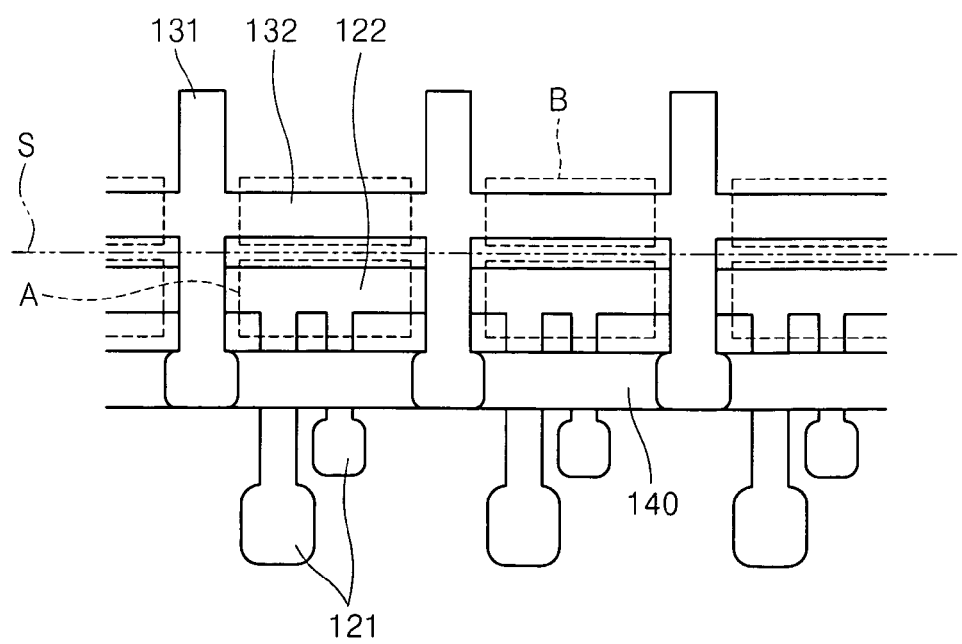
FIG. 6 is a schematic partial enlarged view illustrating portions of parts of the lead frame of FIG. 2, which are to be removed, according to an embodiment of the present invention.

FIG. 6 is a schematic partial enlarged view illustrating portions of parts of the lead frame 100, illustrated in FIG. 2, which are to be removed (e.g., using punching).

In FIG. 6, the first leads 121 of the lead frame 100, the first dambar 122, the second leads 131, the second dambar 132 and the adhesive member 140 are illustrated. Areas A and B, which are indicated by dotted lines in FIG. 6, are portions of the lead frame 100 that are to be removed (e.g., by a generally rectangular punch) in order to manufacture the semiconductor package 200. Such removing process is a process in which a lead individualization or separation process is performed in order to connect an input/output unit of a semiconductor chip to leads using wire bonding.

The lead individualization process is performed through punching. Main portions to be removed are the areas A and B. As shown, a perimeter of the area A, which is defined as a portion of the lead frame 100 between the second dambar 132 and the adhesive member 140 and between adjacent second leads 131, bounds a portion of the first dambar 122 and portions of each of the first leads 121. The perimeter of the area B bounds a portion of the second dambar 132.

Additionally, a line S indicated between areas A and B by a two-dot chain in FIG. 6 defines a baseline or outer perimeter for molding, which is performed by coating a mold resin on the lead frame 100 and chip thereon to encapsulate or surround the chip and at least a portion of the lead frame 100. That is, the resin may extend inward from the line S to encapsulate a center portion of the lead frame 100 where the chip is configured.

In the lead individualization process, when the areas A and B are removed, the leads can be easily individualized since the first leads 121 and the second leads 131 are arranged so as not to overlap with each other, as described above. However, if the first leads 121 and the second leads 131 are arranged so as to overlap each other, when the first leads 121 are individualized using punching, a part of the second leads 131 are also broken.

In the lead individualization process, the area A is removed using punching, and then the area B is removed using punching. When the area A is punched, parts of the first dambar 122 that support the first leads 121 are removed. Thus, at this point, all of the first leads 121 are electrically individualized, isolated or separated, and the individualized first leads 121 are supported by the adhesive member 140.

According to the current embodiment of the present invention, since the molding is performed to the line S, the area B is not molded during semiconductor packaging of the semiconductor package 200. Accordingly, the portions in area B can be removed after semiconductor packaging of the semiconductor package 200.

According to the current embodiment of the present invention, the area B is illustrated adjacent to the line S defining a packaging line. However, according to design, the area B can be replaced by a rail (not shown) of a lead frame which substantially supports the second leads 131. In such structure, when semiconductor packaging is completed and a semiconductor package is individualized, the semiconductor package can be separated from the rail of the lead frame strip. It is not required that the area B be removed prior to individualization of the completed semiconductor package, and in this case, a plating layer formed on the lead frame 100 is hardly broken, and a sectional shape of the plating layer is hardly exposed. Thus, corrosion can be prevented due to a stamping surface of a lead, which is one factor for determining the reliability of a semiconductor package.

According to the current embodiment of the present invention, the area B is not molded during packaging, however the present invention is not limited thereto. That is, according to the present invention, molding can be performed in area B according to design. In this case, the area B is removed prior to molding.

According to the current embodiment of the present invention, the area A is first removed using punching in the lead individualization process, and then the area B is removed using punching. However, the present invention is not limited thereto. That is, according to the present invention, the area B can be first removed, and then the area A can be removed. Also, for a convenience in terms of process, the areas A and B can be simultaneously removed in one punching operation.

Figure 7:
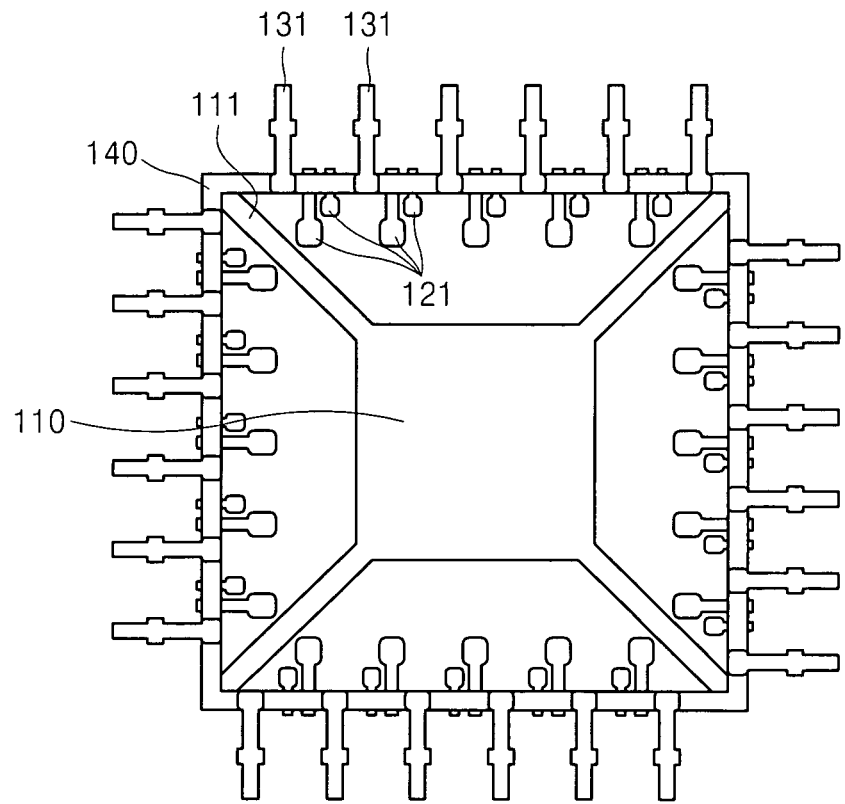
FIG. 7 is a plan view of the lead frame when a lead individualization process is completed, according to an embodiment of the present invention.
Figure 8:
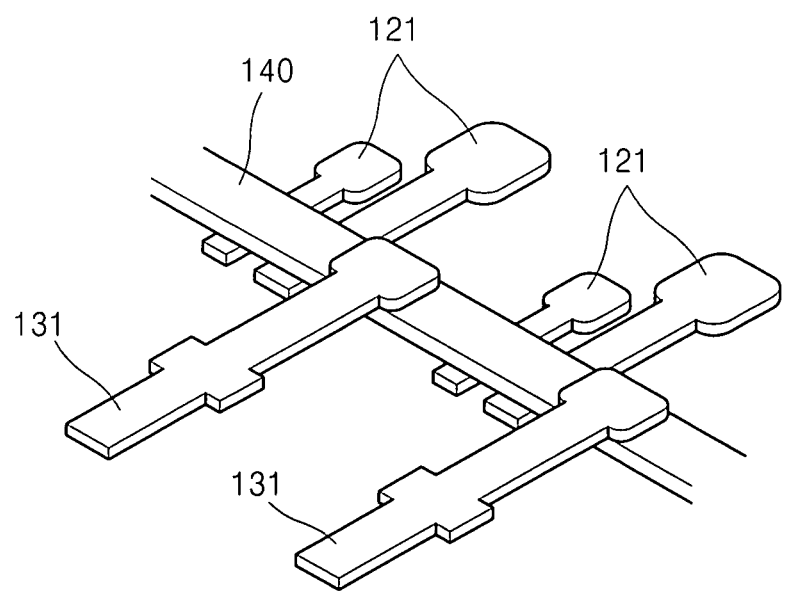
FIG. 8 is an enlarged perspective view of first leads, second leads and an adhesive member of the lead frame of FIG. 7.

The lead frame 100 in the case when the lead individualization process is completed is illustrated in FIGS. 7 and 8.

FIG. 7 is a plan view of the lead frame 100 when the lead individualization process is completed, according to an embodiment of the present invention. FIG. 8 is an enlarged perspective view of the first leads 121, the second leads 131 and the adhesive member 140 of the lead frame 100 of FIG. 7.

Figure 9:
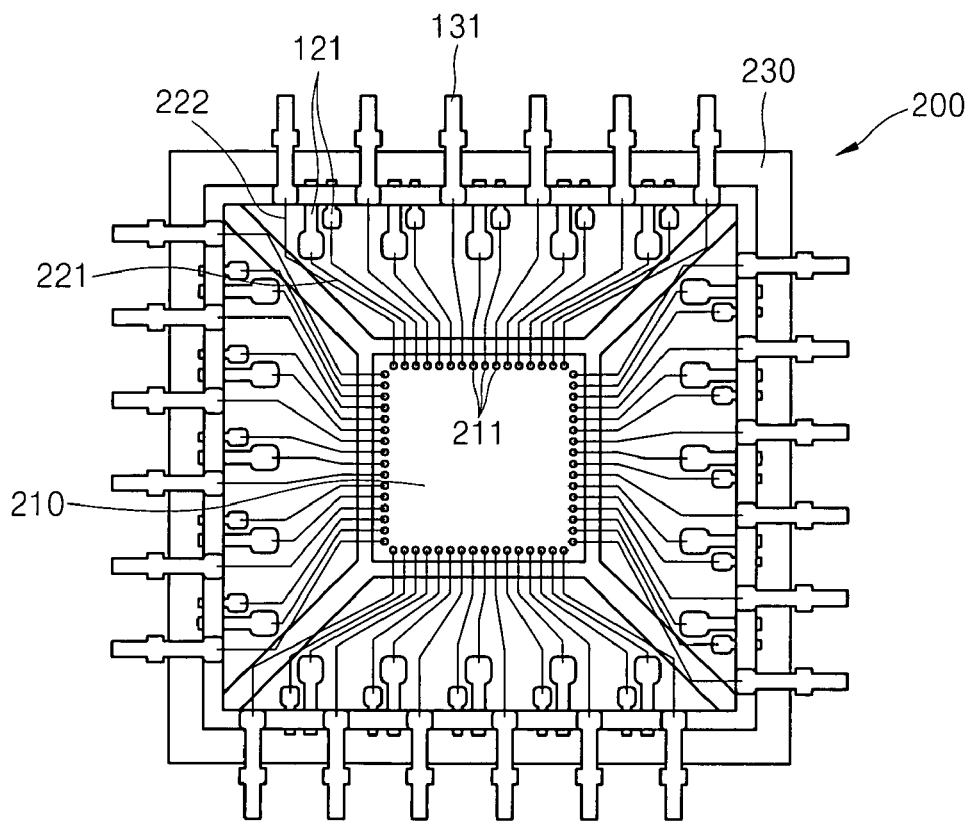
FIG. 9 is a schematic view illustrating an inner structure of a semiconductor package, according to an embodiment of the present invention.
Figure 10:
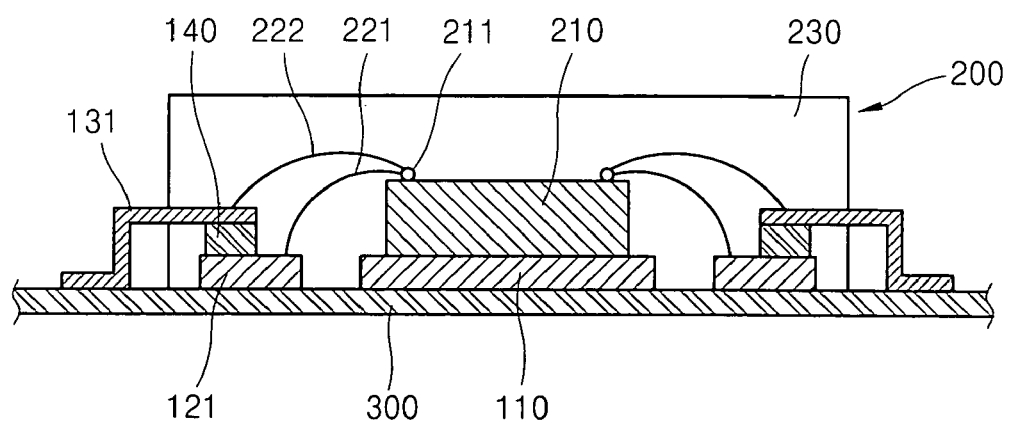
FIG. 10 is a cross-sectional view when the semiconductor package is installed on an external circuit board, according to an embodiment of the present invention.

Referring to FIGS. 7 and 8, the lead frame 100 has an appropriate shape so that the first leads 121 and the second leads 131 are each individualized so as to be used in the semiconductor package 200. That is, as described above, the first leads 121 and the second leads 131 are respectively adhered to opposite sides of the adhesive member 140, and thus the first leads 121 and the second leads 131 are spaced from each other and fixed to the adhesive member 140. Additionally, a semiconductor chip 210 can be arranged on the die pad 110 of the lead frame 100 as illustrated in FIGS. 9 and 10. The semiconductor chip 210 may be fixed onto the die pad 110 by adhesives or the like.

As shown in FIGS. 9 and 10, a plurality of input/output units 211 of the semiconductor chip 210, and the first leads 121 and the second leads 131, which are individualized, are each electrically connected to either a first conductive wire 221 or a second conductive wire 222.

The first conductive wires 221 and the second conductive wires 222 are installed using wire bonding, and are formed of a gold wire including gold (Au).

According to the current embodiment of the present invention, the first conductive wires 221 and the second conductive wires 222 are formed of Au, however the present is not limited thereto. That is, the first conductive wires 221 and the second conductive wires 222 according to the present invention can be formed of any material having high electrical conductivity.

Then, molding is performed on the semiconductor chip 210, the die pad 110, the first leads 121, the second leads 131, the adhesive member 140, the first conductive wire 221 and the second conductive wire 222 by using a mold resin 230.

During molding, the first leads 121 are exposed to the outside of the package 200 via a bottom surface of the semiconductor package 200, and the second leads 131 are exposed to the outside from a side of the semiconductor package 200. Thus, an external circuit board can be electrically connected to the semiconductor package 200.

In the present embodiment, the mold resin 230 is formed of a material including epoxy, however, the present invention is not limited thereto. Hence, a mold resin can be used such that its material is non-conductive and can protect a semiconductor chip or the like.

An inner structure of the semiconductor package 200 manufactured as described above is illustrated in FIG. 9.

As illustrated in FIG. 10, the manufactured semiconductor package 200 is installed on an external circuit board 300.

Referring to FIG. 10, one end of each of the second leads 131 of the semiconductor package 200 may be bent so as to be electrically connected to a circuit unit formed on the external circuit board 300 (e.g., by solder paste), and thus the semiconductor package 200 can be surface-mounted. In addition, the first leads 121 are electrically connected to a circuit pattern formed on the external circuit board 300 by the solder paste, or the first leads 121 are electrically connected to the circuit pattern by using a conductive layer or a conductive ball that is formed of Au, eutectic tin (Sn)/lead (Pb) or the like.

As described above, the semiconductor package 200 includes the lead frame 100, and thus the number of leads, which are electrically connected to the external circuit board 300, can be increased. Accordingly, the high performance and low manufacturing costs of the semiconductor package 200 can be realized.

The semiconductor package 200 can be manufactured without sawing process in which a part of the inside of leads is exposed the outside in order to individualize the leads. Thus, the problems due to corrosion of the leads can be resolved, and the reliability of the semiconductor package 200 can be improved. Also, the semiconductor package 200 can be manufactured without post-processing, and thus manufacturing costs can be reduced.

According to the present invention, a lead frame and a semiconductor package are provided such that the semiconductor package having high reliability can be realized with low manufacturing costs.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A lead frame comprising:
a first lead frame portion including a plurality of first leads, the plurality of the first leads having a first spaced apart configuration;
a second lead frame portion including a plurality of second leads, the plurality of the second leads having a second spaced apart configuration complementary to the first spaced apart configuration such that the plurality of the first leads and the plurality of the second leads do not overlap; and
an adhesive member coupling the first and second lead frame portions together, the first leads being adhered to one surface of the adhesive member and the second leads being adhered to an opposite surface of the adhesive member.

2. The lead frame of claim 1 further comprising a die pad configured to receive a semiconductor chip.

3. The lead frame of claim 2, wherein the die pad is connected to the first lead frame portion.

4. The lead frame of claim 2, wherein the die pad is connected to the second lead frame portion.

5. A lead frame comprising:
a first lead frame portion including a plurality of first leads, the plurality of the first leads having a first spaced apart configuration;
a second lead frame portion including a plurality of second leads, the plurality of the second leads having a second spaced apart configuration complementary to the first spaced apart configuration; and
an adhesive member coupling the first and second lead frame portions together, the first leads being adhered to one surface of the adhesive member and the second leads being adhered to an opposite surface of the adhesive member,
wherein the first lead frame portion further includes a dambar, the first leads being supported by and extending from the dambar.

6. The lead frame of claim 5, wherein the second lead frame portion further includes a second dambar, the second leads being supported by and extending from the second dambar.

7. The lead frame of claim 1, wherein the adhesive member comprises a base film and adhering portions on both sides of the base film.

8. A semiconductor package comprising:
a semiconductor chip including a plurality of input/output units;
a die pad on which the semiconductor chip is installed;
a plurality of first leads spaced apart from the die pad, the plurality of the first leads having a first spaced apart configuration;
an adhesive member having a first adhesive surface and a second adhesive surface, the plurality of first leads being adhered to one of the first and second adhesive surfaces;
a plurality of second leads spaced apart from the die pad, the plurality of the second leads having a second spaced apart configuration complementary to the first spaced apart configuration, the plurality of second leads being adhered to the other one of the first and second adhesive surfaces;
first conductive wires electrically connecting a first portion of the input/output unit to the plurality of first leads;
second conductive wires electrically connecting a second portion of the input/output unit to the plurality of second leads; and
an encapsulation for surrounding the semiconductor chip.

9. The semiconductor package of claim 8, wherein the encapsulation is configured to surround at least portions of the plurality of first leads.

10. The semiconductor package of claim 8, wherein the encapsulation is configured to surround at least portions of the plurality of second leads.

11. The semiconductor package of claim 8, wherein the encapsulation comprises a resin.

12. The semiconductor package of claim 11, wherein the resin is an epoxy resin.

13. The semiconductor package of claim 8, wherein the adhesive member comprises a base film, the first and second adhesive surfaces being defined by adhering portions formed on both sides of the base film.

14. A lead frame comprising:
a first lead frame portion including a plurality of first leads, the plurality of the first leads having a first spaced apart configuration;
a second lead frame portion including a plurality of second leads, the plurality of the second leads having a second spaced apart configuration complementary to the first spaced apart configuration;
an adhesive member coupling the first and second lead frame portions together, the first leads being adhered to one surface of the adhesive member and the second leads being adhered to an opposite surface of the adhesive member; and
a die pad configured to receive a semiconductor chip, wherein the die pad is connected to the first lead frame portion.

* * * * *